United States Patent [19]

Mezger et al.

[11] Patent Number: 4,748,841

[45] Date of Patent: Jun. 7, 1988

[54] METHOD OF PRODUCING AN ELECTRIC CONTACT PIN FOR PRINTED CIRCUIT BOARDS, AND DIE FOR CARRYING OUT THE METHOD

[75] Inventors: Dieter Mezger, Boblingen; Josef Projer, Urbach; Ewald Siewert, Illingen, all of Fed. Rep. of Germany

[73] Assignee: Alcatel N.V., Amsterdam, Netherlands

[21] Appl. No.: 853,097

[22] Filed: Apr. 17, 1986

[30] Foreign Application Priority Data

Apr. 17, 1985 [DE] Fed. Rep. of Germany ....... 3513768

[51] Int. Cl.$^4$ ..................... B21D 28/14; H01R 43/16
[52] U.S. Cl. ......................................... 72/326; 29/882; 439/751
[58] Field of Search ................. 72/326, 325, 359, 358; 29/874, 882; 339/221 R, 221 M, 220 R, 17 C, 17 M, 252 P; 439/751, 741-743

[56] References Cited

U.S. PATENT DOCUMENTS

| | | | |
|---|---|---|---|
| 493,791 | 3/1893 | Schurig | 72/326 |
| 2,460,231 | 1/1949 | Matthysse | 29/882 |
| 3,545,080 | 12/1970 | Evans | 29/874 |
| 3,751,960 | 8/1973 | Morton et al. | 72/326 |
| 4,066,326 | 1/1978 | Lovendusky | 339/221 M |
| 4,443,053 | 4/1984 | Astbury | 339/221 M |

FOREIGN PATENT DOCUMENTS

| | | | |
|---|---|---|---|
| 2435461 | 2/1975 | Fed. Rep. of Germany ... | 339/221 R |
| 2545505 | 4/1976 | Fed. Rep. of Germany . | |
| 2930560 | 1/1981 | Fed. Rep. of Germany ........ | 72/325 |
| 896765 | 5/1962 | United Kingdom .................. | 29/874 |

OTHER PUBLICATIONS

European Patent Application No. 105044, Verbruggen, April 4, 1984.

Primary Examiner—Daniel C. Crane
Attorney, Agent, or Firm—Spencer & Frank

[57] ABSTRACT

A method is disclosed for producing contact pins having a mounting portion including three resilient legs. The mounting portion permits solderless mounting of the contact pin in plated-through holes of printed circuit boards. In a single combined stamping and cold extrusion operation, the three legs are brought to a position in which they make an angle of 120 degrees with each other. A die used for the production process includes a female and a male part. To form a first leg of the mounting portion, a punch in the male part is lowered into a corresponding slot in the female part. To form the two other legs, material from the shank of the contact pin is displaced by inclined surfaces of the female part into two recesses corresponding with these surfaces, the recesses being located at the two long sides of the punch in the male part.

7 Claims, 2 Drawing Sheets

– 1 –

METHOD OF PRODUCING AN ELECTRIC CONTACT PIN FOR PRINTED CIRCUIT BOARDS, AND DIE FOR CARRYING OUT THE METHOD

BACKGROUND OF THE INVENTION

1. Field of the Invention

The present invention relates to a method of producing a contact pin, particularly its mounting portion, by which the contact pin can be press-fitted in a plated-through hole of a printed circuit board.

2. Description of the Prior Art

Numerous designs of mounting portions of such contact pins are known. The German application DE-OS No. 29 30 560, for example, describes a contact pin having two resilient legs. Its mounting portion is produced by splitting its shaft which is of square cross section and simultaneously expanding it with the aid of two wedges. During the expanding step, the split shank halves are pressed against shell-shaped abutments, and are thus provided with a rounded surface. A contact pin having a mounting portion which ensures better distribution of forces is disclosed in U.S. Pat. No. 3,545,080. In one embodiment of that pin three resilient members are formed by stamping several slots and cutouts into a blank of flat stock. The bridges thus obtained are bent to form the spring members and the metal sheet is subsequently rolled up to form a hollow contact pin having three spring members disposed at 120° from each other. The shank of such a contact pin, however, has a circular cross-sectional area and is thus unsuitable for wire-wraping.

EP-A-O No. 105 044 discloses a contact pin of rectangular cross section whose mounting portion is cut out from a central part which is wider than the shank. With the aid of two longitudinal cuts, three resilient legs are formed, the central one of which is bent in one direction in the plane of the cut, while the other two are bent in the opposite direction.

The rear ends of the two outer resilient legs overlap the corresponding end of the central leg. Thus, when the contact pin is inserted into a hole, the center leg acts like a wedge which is clamped by the two outer legs taking up a V-shaped position. This arrangement of three legs, however, limits their resilient properties.

A method of producing a contact pin of the type to be made according to the present invention is described in the German application DE-OS No. 25 45 505. As in EP-A-O No. 105 044, three resilient legs are stamped, of which two outer ones are twisted away from each other in an additional step so that all three surfaces designed to make contact with the hole wall are equidistant from each other. In the twisting step, the rear ends of the legs are brought to a position in which they are only a small distance apart from each other, whereby the deflection of the resilient legs is closely limited.

SUMMARY OF INVENTION

It is the object of the present invention to provide a simple method of producing contact pins whose mounting portions, including three resilient legs, can be mounted in plated-through holes without additional soldering, and whose standard diameter may vary within relatively wide tolerance limits, and to provide a die for carrying out the method.

The invention provides for the complete production of contact pins in a single step which is very economical. By the application of a combined stamping and cold extrusion process, the contact pins can be manufactured at very reasonable costs. This is of great advantage since contact pins are mass-produced and used in large quantities in various electronic equipment.

Advantageously, the die consists of only two relatively simple parts which have a long tool life. No further tools are required to form the mounting portion of the pin. The male part is controlled only by lowering and lifting movements which permit a highcycle speed. The contact pins thus produced can be safely press-fitted into holes of printed circuit boards, the angles of 120° made by their resilient legs providing equal distribution of forces, even in case of negative tolerances of the holes. The relatively large spring deflection of the second and third legs prevents damage to the cladding.

BRIEF DESCRIPTION OF THE DRAWINGS

The invention will be better understood after a reading of the Detailed Description of the Preferred Embodiment taken in conjuction with the accompanying drawings, in which.

Figure 1:
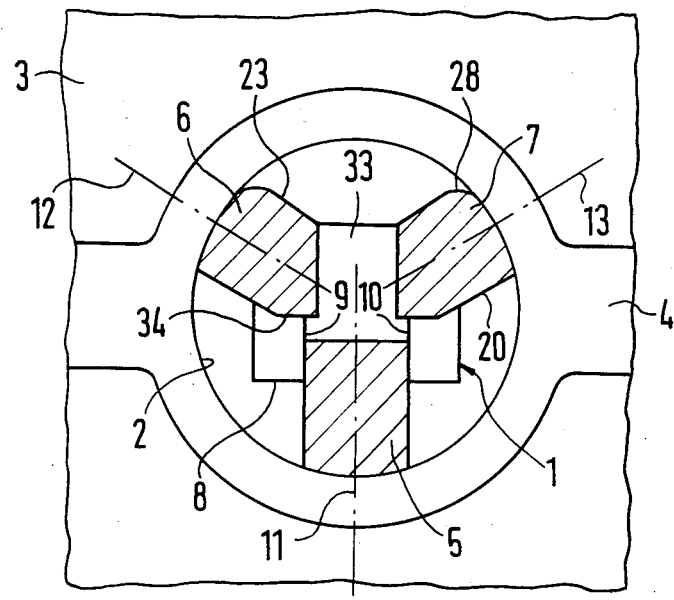
FIG. 1 shows a contact pin made according to the method of the invention shown inserted into the hole of a printed circuit board with the mounting portion of the pin shown in cross section.

DETAILED DESCRIPTION OF THE PREFERRED EMBODIMENT:

Throughout the drawings, the electric contact pin, preferably having a rectangular cross section, is designated by the reference numeral 1. The pin 1 has an expanded central portion for resiliently mounting the pin in a plated-through hole 2 of a printed circuit board 3, including conductors 4.

As shown best in FIG. 1, the central portion of the contact pin 1 has three resilient legs 5, 6, 7, of which a first leg 5 is bent outwardly on a broadside 8 of the contact pin 1 to form a bridge. The leg 5 is formed by a stamping operation in which two spaced-apart parallel longitudinal cuts 9, 10 separate the contact pin 1 in the axial direction. During stamping, the second and third legs 6, 7, whose axis 12, 13 make an angle of preferably 120 degrees with the axis 11 of the first leg 5, are formed by cold extrusion.

Figure 2:
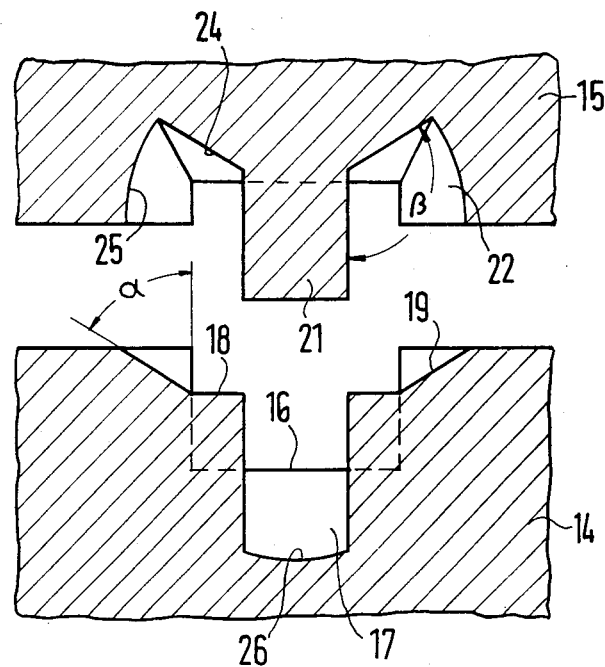
FIG. 2 is a partial cross-sectional view of a die for forming the mounting portion of a contact element according to the method of the invention showing details of a female part and a male part of the die.
Figure 4:
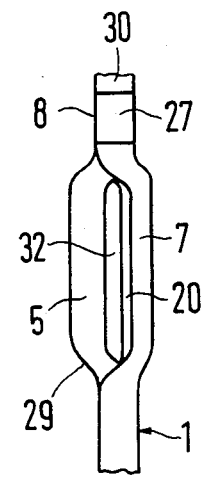
FIG. 4 shows a side view of the contact pin of FIG. 3.

FIG. 2 shows a die used to form the contact pin 1. The die includes a female part 14 and a male part 15. The female part 14 has a portion for receiving the contact pin 1, which portion includes a bearing surface 16 and a tub-shaped slot 17 in the center of the bearing surface 16 for forming the first leg 5. In the present embodiment, the width of the slot is equal to half the side legnth of the contact-pin shank. From the bearing surface 16, a bridge-like projection 18 having a width equal to one quarter of the side length of the contact-pin shank rises on both long sides of the slot 17. From the surface of each of the projections 18 a laterally inclined surface 19 extends to the parting line of the two parts of the die. With these surfaces 19, long sides 20 of the second and third legs 6,7, which sides project beyond the contact-pin shank, are formed (FIGS. 1 and 4). Each of the surfaces 19 makes an angle of 60° with the direction of closure of the two parts of the die.

The male part 15 of the die includes a punch 21 cooperating with and complementary to the slot 17 in the female part 14. The punch 21 projects beyond the parting line of the male part 15 and, when the two parts of the die close, partly enters the slot 17 of the female part 14. Beside each of the two long sides of the punch 21, the part 15 has a recess 22 into which the displaced material spreads when the two die parts are closed. To form the second long side 23 of the second and third legs 6, 7 of the contact pin 1, the recesses 22 each have an inclined surface 24. These surfaces are parallel to the corresponding surface 19 of the female part 14, i.e., they make an angle of 120° with the direction of closure of the two parts of the die. With the two parts of the die closed, the long sides 20, 23 of the second and third legs 6, 7 formed by the inclined surfaces 19, 24 are separated by a distance equal to the width of the slot 17 in the female part 14. From the outer end of the inclined surfaces 24 to the parting line of the two parts of the die, there extends one curved wall portion 25 limiting the recesses 22. These wall portions 25 and the corresponding wall portion 26 at the bottom of the slot 17 of the female part 14 form the outer surfaces of the three legs 5, 6, 7 of the contact pin 1, whose radii are adapted to the radius of the hole 2 in the printed circuit board 3. Therefore, with the two parts of the die closed, the surfaces of the three wall portions 25, 26, mentioned above lie on a circle whose center coincides with the longitudinal axis of the contact pin 1 lying in the receiving portion. The diameter of that circle, however, is slightly larger than the hole diameter in the printed circuit board 3, which has a standardized diameter of e.g., 1.5 mm.

Figure 3:
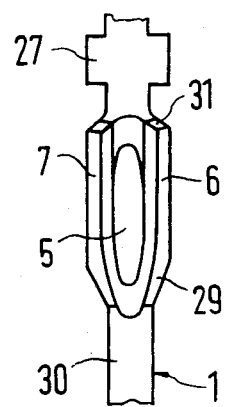
FIG. 3 is a partial front view of a contact pin with a mounting portion formed by the die of FIG. 2.

The contact pin 1 is stamped from sheet metal in a single step such that a stop 27 is obtained which limits the depth of insertion (FIG. 3). When the male part 15 is lowered, the central portion which later forms the mounting portion of the contact pin 1 is produced. In this step, the first leg 5 is stamped and its curved outer surface is formed, and the second and third legs 6, 7 are formed by cold extrusion, causing transverse displacement of the material. Because the corners of the recesses 22 of the male part 15 in the area of transition between the inclined surfaces 24 and the curved wall portions 25 serve to compensate for dimensional variations and are therefore not completely filled with material during cold extrusion, the legs 6, 7 have rounded edge 28 (FIG. 1).

As can be seen from FIGS. 3 and 4, the recesses for forming the three legs 5, 6, 7 in the female part 14 and in the male part 15 can be designed asymmetrically in such a manner that the legs, at the ends 29 designed for pressing into a hole 2 of the circuit board 3, have a relatively slight slope at the shank 30 of the contact pin 1, while the opposite ends 31 have a relatively steep slot. Independent thereof, when the legs 5, 6, 7 are formed in the die, they are pressed so far in oposite directions by the shank 30 of the contact pin 1 that an air gap 32 is formed between the first leg 5 and the two other legs 6, 7 (FIG. 4).

If the contact pin 1 is inserted into the hole 2 of a circuit board 3, its legs 5, 6, 7 move radially inwards. In so doing, the second and third legs 6, 7 narrow the space 33 out of which the first leg 5 was stamped (FIG. 1). Simultaneously, the width of the air gap 32 between the first leg 5 and the other two legs 6,7 is reduced. If there is a negative tolerance in the diameter of the hole 2, the air gap 32 can close completely. Since the second and third legs 6, 7 previously pressed inwards by the hole wall, prevent the first leg 5 from being wedged between them, their spring action is preserved in this case, too. In this case, because of the surface 34 pressed through by the projections 18 of the female part 14 during stamping, the otherwise radially inward displacement the second and third legs 6, 7 is changed into a lateral direction of movement. It should be mentioned here that prior to the mounting of the contact pin 1, the surfaces 34 adjoining the long sides 20 of the second and third legs 6, 7 are on a level with the longitudinal axis of the contact pin shank 30 and that, furthermore, the axes 11, 12, 13 of all legs 5, 6, 7 intersect the longitudinal axis of the shaft 30.

As free shanks 30 of the contact pins 1 serve as contact posts for wire wraps and/or plug pins, the shanks 30 have a rectangular cross section with a usual side length of, e.g., 0.8×1.00 mm. Of course, the contact pins provided with mounting portions can also be integral parts of a contact bridge designed as an edge connector, at which they are bent at right angles in accordance with the hole pattern of the circuit board 3, e.g., at two opposite long sides of a sheet-metal strip.

What is claimed is:

1. A method of producing an electric contact pin for printed circuit boards, of the type including a central portion for mounting in a hole in the circuit board, the central portion having two longitudinal cuts which separate the contact pin to form three resilient bridge-like legs a first of which is bent outwardly in the direction of the cutting plane of said cuts and the two other legs are bent outwardly at an obtuse angle to the first leg, comprising the steps of forming said first, said second and said third legs in die means adapted to simultaneously form the first leg by stamping, and the second and third legs by cold extrusion wherein said cold extrusion provides for transverse displacement of material thereby producing radially extending second and third legs and wherein, during the cold extrusion, radial axes of the second and third resilient legs formed hereby are brought to a position in which they make an angle of 120 degrees with the radial axis of the first leg formed by said stamping.

2. A die for forming an electrical contact pin, the die comprising a female part including a portion for receiving a shank of the contact pin, a bearing surface of the receiving portion, having a longitudinally disposed slot for forming a first leg of said pin beside which slot a projection for forming a second and a third leg rises from the bearing surface and is provided below a parting line of the die, a surface of the projection passing into an outwardly inclined surface ending at the parting line of the die, a male part including a punch corresponding to the slot in the female part for forming the first leg, beside which punch there is a recess for forming the second leg and the third leg respectively, said recess having an inclined surface disposed parallel to the inclined surface of the female part.

3. A die as claimed in claim 3, wherein each of the two inclined surfaces of the female part make an angle of 60° with the direction of closure of the die, and each of the two corresponding inclined surfaces of the male part make an angle of 120 degrees with said direction of closure.

4. A die as claimed in claim 3, wherein with the die closed the inclined surfaces of the female and the male parts are separated by a distance equal to the width of the slot in the female part.

5. A die as claimed in claim 3 wherein the slot in the female part is half as wide as the portion for receiving the shank of the contact pin.

6. A die as claimed in claim 3 wherein said male part includes wall portions defining wall surfaces extending from an outer end of the inclined surfaces in the recesses of the male part to the parting line of the die, and the wall portion of said female part forming the bottom of the slot in the female part lies on a circle whose center coincides with the longitudinal axis of the contact pin lying in the receiving portion.

7. A die for forming an electrical contact pin, the die comprising a female part including a portion for receiving a shank of the contact pin, a bearing surface of the receiving portion, having a slot for forming a first leg of said pin beside which slot a porjection for forming a second and a third leg rises from the bearing surface, a surface of the projection passing into an outwardly inclined surface ending at a parting line of the die, a male part including a punch corresponding to the slot in the female part for forming the first leg, beside which punch there is a recess for forming the second leg and the third leg respectively, said recess having an inclined surface disposed parallel to the inclined surface of the female part and wherein each of the two inclined surfaces of the female part make an angle of substantially 60 degrees with the direction of closure of the die, and each of the two corresponding inclined surfaces of the male part make an angle of substantially 120 degrees with said direction of closure

* * * * *